(12) United States Patent
Mulukutla et al.

(10) Patent No.: US 10,380,755 B2
(45) Date of Patent: Aug. 13, 2019

(54) WHOLE OBJECT SURFACE AREA AND VOLUME OF PARTIAL-VIEW 3-D MODELS

(71) Applicant: University of New Hampshire, Durham, NH (US)

(72) Inventors: Gopal Mulukutla, Milford, CT (US); Alexander Prusevich, Durham, NH (US)

(73) Assignee: University of New Hampshire, Durham, NH (US)

( * ) Notice: Subject to any disclaimer, the term of this patent is extended or adjusted under 35 U.S.C. 154(b) by 72 days.

(21) Appl. No.: 15/819,490

(22) Filed: Nov. 21, 2017

(65) Prior Publication Data
US 2018/0144493 A1 May 24, 2018

Related U.S. Application Data

(60) Provisional application No. 62/424,713, filed on Nov. 21, 2016.

(51) Int. Cl.
*G06T 7/62* (2017.01)
*G06T 15/06* (2011.01)
(Continued)

(52) U.S. Cl.
CPC ............... *G06T 7/62* (2017.01); *G01B 15/00* (2013.01); *G06T 15/06* (2013.01); *G06T 17/10* (2013.01);
(Continued)

(58) Field of Classification Search
CPC .......... G06T 7/62; G06T 15/06; G06T 17/10; G06T 17/20; G06T 2207/10028;
(Continued)

(56) References Cited

U.S. PATENT DOCUMENTS

| 9,396,400 B1* | 7/2016 | Teichman | G06K 9/00771 |
| 2014/0119624 A1* | 5/2014 | Ehlers | A61B 5/0066 |
| | | | 382/131 |

(Continued)

OTHER PUBLICATIONS

Labatut, Patrick, Jean-Philippe Pons, and Renaud Keriven. "Efficient multi-view reconstruction of large-scale scenes using interest points, delaunay triangulation and graph cuts." In 2007 IEEE 11th international conference on computer vision, pp. 1-8. IEEE, 2007. (Year: 2007).*

(Continued)

*Primary Examiner* — Carol Wang
(74) *Attorney, Agent, or Firm* — Finch & Maloney PLLC

(57) ABSTRACT

A technique for estimating a whole object surface area and volume of a micro-scale three-dimensional model with a partially visible surface includes receiving a single-view stereoscopic image of an object of interest and an unconstrained three-dimensional point cloud of the object, generating a constrained three-dimensional point cloud using the image, the unconstrained three-dimensional point cloud, and a digital elevation model (DEM) of the object generated from the image, generating, using the constrained three-dimensional point cloud, a three-dimensional mesh representing an estimate of the surface of the object, calculating a partial surface area and/or partial volume of the object using the three-dimensional mesh, estimating an extent of a visible surface of the object, and calculating a whole surface area and/or a whole volume of the object based on the partial surface area of the object and the estimated extent of the visible surface of the object.

9 Claims, 10 Drawing Sheets

(51) Int. Cl.
    G06T 17/10    (2006.01)
    G06T 17/20    (2006.01)
    G01B 15/00    (2006.01)
    H01J 37/28    (2006.01)
(52) U.S. Cl.
    CPC .............. *G06T 17/20* (2013.01); *H01J 37/28*
        (2013.01); *G06T 2207/10012* (2013.01); *G06T
            2207/10028* (2013.01); *G06T 2207/10061*
            (2013.01); *G06T 2207/20024* (2013.01); *G06T
            2207/20036* (2013.01); *G06T 2207/30104*
            (2013.01); *G06T 2207/30181* (2013.01)
(58) Field of Classification Search
    CPC . G06T 2207/30181; G06T 2207/10061; G06T
            2207/20024; G06T 2207/20036; G06T
            2207/30104; G06T 2207/10012; H01J
            37/28; G01B 15/00
    See application file for complete search history.

(56)            References Cited

U.S. PATENT DOCUMENTS

2015/0088475 A1*  3/2015  McKennon-Kelly .... B64G 3/00
                                                    703/6
2017/0105601 A1*  4/2017  Pheiffer ............. A61B 1/00009

OTHER PUBLICATIONS

Andruleit et al., "Stereo-Microscopy of Coccolithophores—Modern Applications for Imaging and Morphological Analysis", Journal of Nannoplankton Research, 2006, pp. 1-16, vol. 28 (1).
Bullard et al., "Defining Shape Measures for 3D Star-Shaped Particles: Sphericity, Roundness, and Dimensions", Powder Technology, 2013, pp. 241-252, vol. 249. <http://dx.doi.org/10.1016/j.powtec.2013.08.015>.
Carli et al., "Uncertainty Evaluation for Three-Dimensional Scanning Electron Microscope Reconstructions Based on the Stereo-Pair Technique", Measurement Science and Technology, p. 35103, vol. 22 (3). <http://stacksiop.org/0957-0233/22/i=3/a=035103?key=crossref.8e187859d88089a769558b796bb21b84>.
Chen et al., "Three-Dimensional Surface Reconstruction of Diatomaceous Frustules", Analytical Biochemistry, 2010, p. 63-66, vol. 403 (1-2). <http://dx.doi.org/10.1016/j.ab.2010.04.003.
Ersoy et al., "Surface Area and vol. Measurements of Volcanic Ash Particles by SEM Stereoscopic Imaging", Journal of Volcanology and Geothermal Research, 2010, pp. 290-296, vol. 190 (3-4).
Garboczi et al., "Contact Function, Uniform-Thickness Shell Volume, and Convexity Measure for 3D Star-Shaped Random Particles", Powder Technology, 2013, pp. 191-201, vol. 237. <http://dx.doi.org/1016/j.powtec.2013.01.019>.
Memmolo et al., "3D Morphometry of Red Blood Cells by Digital Holography", Cytometry Part A., 2014, pp. 1030-1036, vol. 85 (12).
Merola et al., "Digital Holography as a Method for 3D Imaging and Estimating the Biovolume of Motile Cells", Lab on a Chip, 2013, pp. 4512-2516, vol. 13 (23). <http://www.ncbi.nlm.nih.gov/pubmed/24129638>.
Merola et al., "Tomographic Flow Cytometry by Digital Holography", Light: Science & Applications, 2017, p. e16241, vol. 6 (4). <http://www.nature.com/doifinder/10.1038/lsa.2016.241>.
Mills et al., "Shape and Surface Area Measurements Using Scanning Electron Microscope Stereo-Pair Images of Volcanic Ash Particles", Geosphere, 2010, pp. 805-811, vol. 6 (6). <http://geosphere.gsapubs.org/cgi/doi/10.1130/GES00558.1>.
Ostadi et al. "3D Visualization and Characterization of Nano Structured Materials", In Proceedings of the IEEE Conference on Nanotechnology, 2011, pp. 770-775.
Papelis et al., "Measuring the Specific Surface Area of Natural and Manmade Glasses: Effects of Formation Process, Morphology, and Particle Size", Colloids and Surfaces A: Physicochemical and Engineering Aspects, 2003, pp. 221-239, vol. 215 (1-3).
Pirard, E., "3D Imaging of Individual Particles: A Review", Image Analysis and Stereology, 2012, pp. 65-77, vol. 31 (2).
Schroeder-Pedersen et al., "A Comparison of Calculated Geometric Surface Area and Measured BET Surface Area for a Metal Powder", ASTM Journal of Testing and Evaluation, 1997, pp. 365-369, vol. 25 (4). http://cat.inist.fr/?aModele=afficheN&cpsidt=2798693>.
Schroettner et al., "Comparison of 3D Surface Reconstruction Data from Certified Depth Standards Obtained by SEM and an Infinite Focus Measurement Machine (IFM)", Microchimica Acta, 2006, pp. 279-284, vol. 155 (1-2).
Stampfl et al., "Reconstruction of Surface Topographies by Scanning Electron Microscopy for Application in Fracture Research", Applied Physics A: Materials Science and Processing, 1996, pp. 341-346, vol. 63 (4).
Tafti et al., "Recent Advances in 3D SEM Surface Reconstruction", Micron, 2015, pp. 54-66, vol. 78.
Alexander A. Proussevitch et al., "A New 3D Method of Measuring Bubble Size Distributions from Vesicle Fragments Preserved on Surfaces of Volcanic Ash Particles", Geosphere, Feb. 1, 2011, pp. 62-69, vol. 7, No. 1.
Chen X et al., "Three-Dimensional Surface Reconstruction of Diatomaceous Frustules", Analytical Biochemistry, Elsevier, Aug. 1, 2010, pp. 63-66, vol. 403, No. 1-2.
PCT Search Report for PCT Application No. PCT/US2017/062751 dated Mar. 9, 2018, 12 pages.
Zolotukhin D A et al., "Three-Dimensional Reconstruction for Scanning Electron Microscope", Pattern Recognition and Image Analysis, Sep. 13, 2011, pp. 582-585, vol. 21, No. 3.

* cited by examiner

WHOLE OBJECT SURFACE AREA AND VOLUME OF PARTIAL-VIEW 3-D MODELS

RELATED APPLICATION

This application claims the benefit of U.S. Provisional Patent Application Ser. No. 62/424,713, filed Nov. 21, 2016, which is hereby incorporated by reference in its entirety.

FIELD OF THE DISCLOSURE

This disclosure relates to the field of Stereoscopic Scanning Electron Microscopy (SSEM), and more particularly, to techniques for estimating the whole surface area and volume of a partial-view 3-D model that is constructed from a set of single-view stereoscopic images.

BACKGROUND

Morphological data collected from micro or nano-scale objects is an important component of numerous studies in physical and life sciences and engineering. Recent emergence of stereoscopic-Scanning Electron Microscopy (SSEM) has resulted in expanded applications to extract quantitative 3-D morphological information from a wide variety of materials. The relatively high range measurement resolution (1 $nm^2$ to 1 $mm^2$), accuracy of measurements, and the short time it takes to capture data and build models (minutes per model) has added a new and powerful feature to one of the most widely used techniques of microscopy.

BRIEF DESCRIPTION OF THE DRAWINGS

The accompanying drawings are not intended to be drawn to scale. In the drawings, each identical or nearly identical component that is illustrated in various figures is represented by a like numeral.

DETAILED DESCRIPTION

Figure 1:
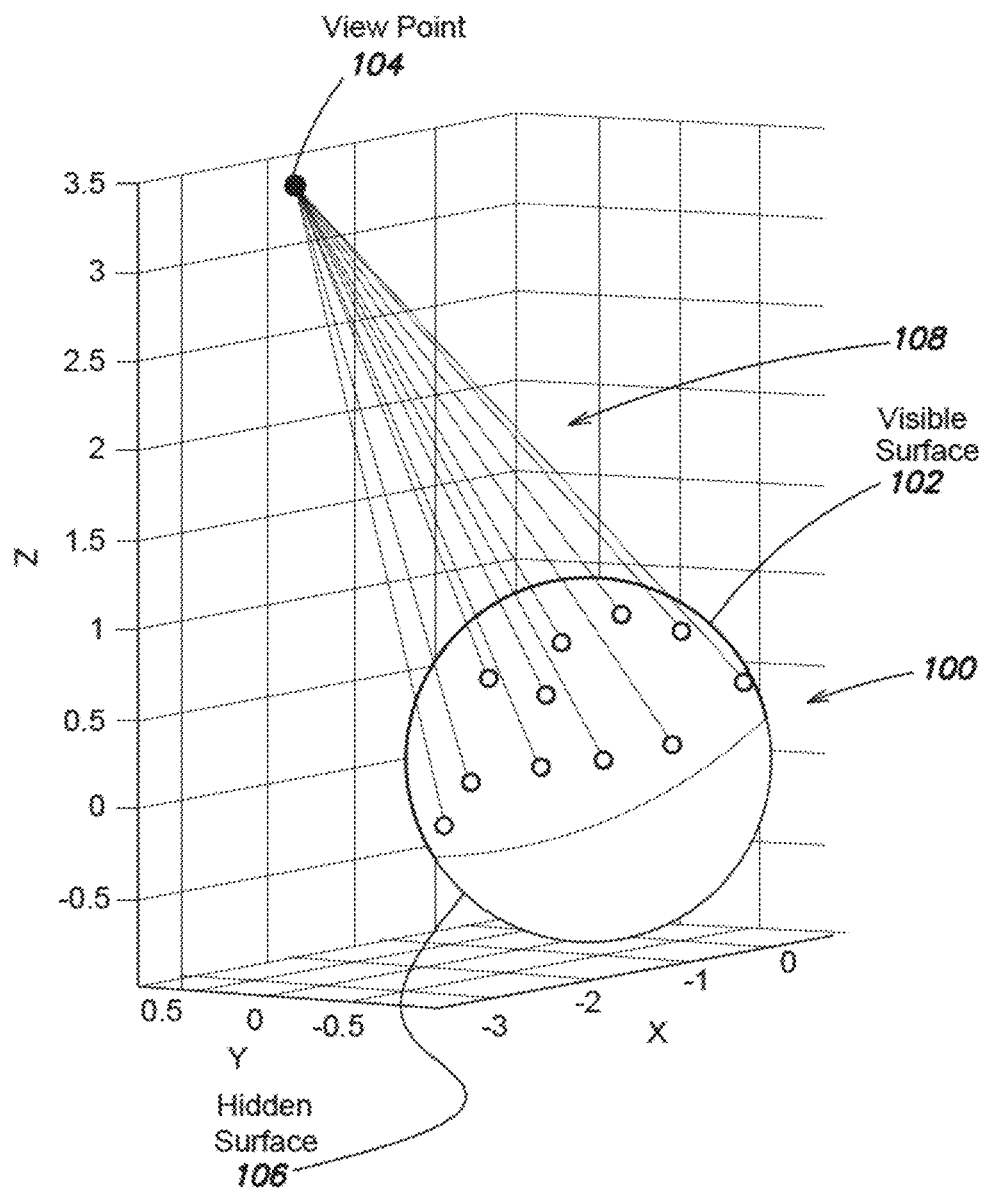
FIG. 1 shows an example representational visualization of a ray tracing analysis, in accordance with an embodiment of the present disclosure.

SSEM techniques involve the capture of two and sometimes three images at a designated angle and a certain method of tilting (eucentric tilting). The inherent disparity between features in each image is used to capture the depth detail of the object of interest and create a digital elevation model (DEM). While SSEM requires collection of images using multiple viewing angles, the difference in angles is usually very small (typically 3-7 degrees) allowing for only the capture of disparity in the surface features but not the entire shape of an object or specimen. DEMs constructed this way can be termed as "partial-view" models, as there are features of the object that are not captured within the model. Depending on the application, individual partial-view DEMs are used directly in analysis or a whole 3-D model is generated from multiple views by the application of complex, reconstruction algorithms that are often time-consuming.

To this end, computer-implemented techniques are disclosed for estimating a whole object surface area and volume of a micro-scale three-dimensional model with a partially visible surface. According to an embodiment of the present disclosure, a method for estimating a whole object surface area and volume of a micro-scale three-dimensional model with a partially visible surface includes receiving a single-view stereoscopic image of an object of interest and an unconstrained three-dimensional point cloud representation of the object of interest, the image generated by a stereoscopic scanning electron microscope and having a plurality of pixels representing the object of interest; generating a constrained three-dimensional point cloud using the image, the unconstrained three-dimensional point cloud representation of the object of interest, and a digital elevation model (DEM) of the object generated from the image, the constrained three-dimensional point cloud including a plurality of points representing a surface of the object of interest within a reference coordinate system; generating, using the constrained three-dimensional point cloud, a three-dimensional mesh representing an estimate of the surface of the object of interest; calculating a partial surface area and/or partial volume of the object of interest using the three-dimensional mesh; estimating an extent of a visible surface of the object of interest; and calculating a whole surface area and/or a whole volume of the object of interest based on the partial surface area of the object of interest and the estimated extent of the visible surface of the object of interest. Numerous variations will be evident in view of this disclosure.

The computer-implemented techniques disclosed herein for estimating a whole object surface area and volume of a micro-scale three-dimensional model with a partially visible surface have several practical and tangible uses. For example, these techniques can be used in volcanic ash transport research to understand the fate and predict the movement of ash that spews out after volcanic eruptions. When Mt. St. Helens erupted in 1980, ash covered more than 10 states, and was up to a few inches deep. Predicting how ash clouds move requires understanding both the shape and size characteristics, which can be estimated using the techniques described herein.

Another example is three-dimensional morphometric analysis of flowing and not-adherent blood cells requiring injection of blood droplets in microfluidic channels, and subsequently imaged in a non-invasive way to determine cell bio-volumes. Due to the dynamic nature of injection and flow, the non-spherical shapes imaged through SSEM require specialized methods to determine bio-volume from partial-view 3-D models. The techniques disclosed herein can be used to estimate non-spherical shapes in this environment. Also, new forms of blood tests require injecting droplets into a fluid and examining the droplet shape and geometry in real time. Droplets are deformed and not spherical and furthermore only limited view images can be taken (stereoscopic images). The accurate calculation of volume is needed, and the techniques described herein can be used to do so.

Yet another example is exact geometric description of microscopic frustules of diatoms, which is important for functional morphology, taxonomy and biogeochemistry. Their small size (approximately 2 micrometer-500 micrometer) and complex shape prevents them from being completely imaged. The techniques described herein can be used to estimate the surface area and volume of such diatoms.

In general, as will be appreciated in view of this disclosure, any area of science, medicine or engineering where particles or objects in the 2-500 micrometer size range needs to physically characterized for surface area and or volume in substantial (statistically significant, n>1) numbers, can benefit from the application of the techniques described herein.

FIG. 1 shows an example representational visualization of a ray tracing analysis, in accordance with an embodiment of the present disclosure, which demonstrates the variation of the visible surface of an object with the viewpoint distance. An object 100, such as a sphere, has a visible surface 102 that is visible, without the aid of any light deforming devices, from a given SSEM viewpoint 104. The object 100 also has a hidden surface 106 that is not visible from the viewpoint 104, due to the shape of the object 100 and the fact that light generally travels in a straight line. A set of rays 108 can be traced from the viewpoint 104 to various points on the visible surface 102 of the object 100. The rays 108, representing light, are noted for their illumination of the object 100. Rays that directly impinge the object 100 create the visible surface 102 and make the rest of the object (i.e., the hidden surface 106) invisible and not part of the resulting 3-D model. The extent of the visible surface 102 of the object 100 captured, via SSEM, in a partial-view DEM can vary due to multiple factors such as object size, shape and working distance used to make the measurements.

In accordance with an embodiment of the present disclosure, an example ray tracing analysis is used to obtain an initial understanding of the extent of the visible surface 102, such as represented in FIG. 1. In this analysis, the object 100 is a sphere (radius, R=1) generated as a hollow meshed polyhedron made of equal-area triangles using a mesh generation routine. The lines depicting rays 108 of visible light, originating at the viewpoint 104 located at a distance of xR (x=[2, 5, 10, 15, 20]) and at a random angle, impinge on each vertex of the triangular mesh forming the visible surface 102. Each ray can be examined to see if it traveled to the interior of the sphere before or after impinging the vertex.

Figure 2:
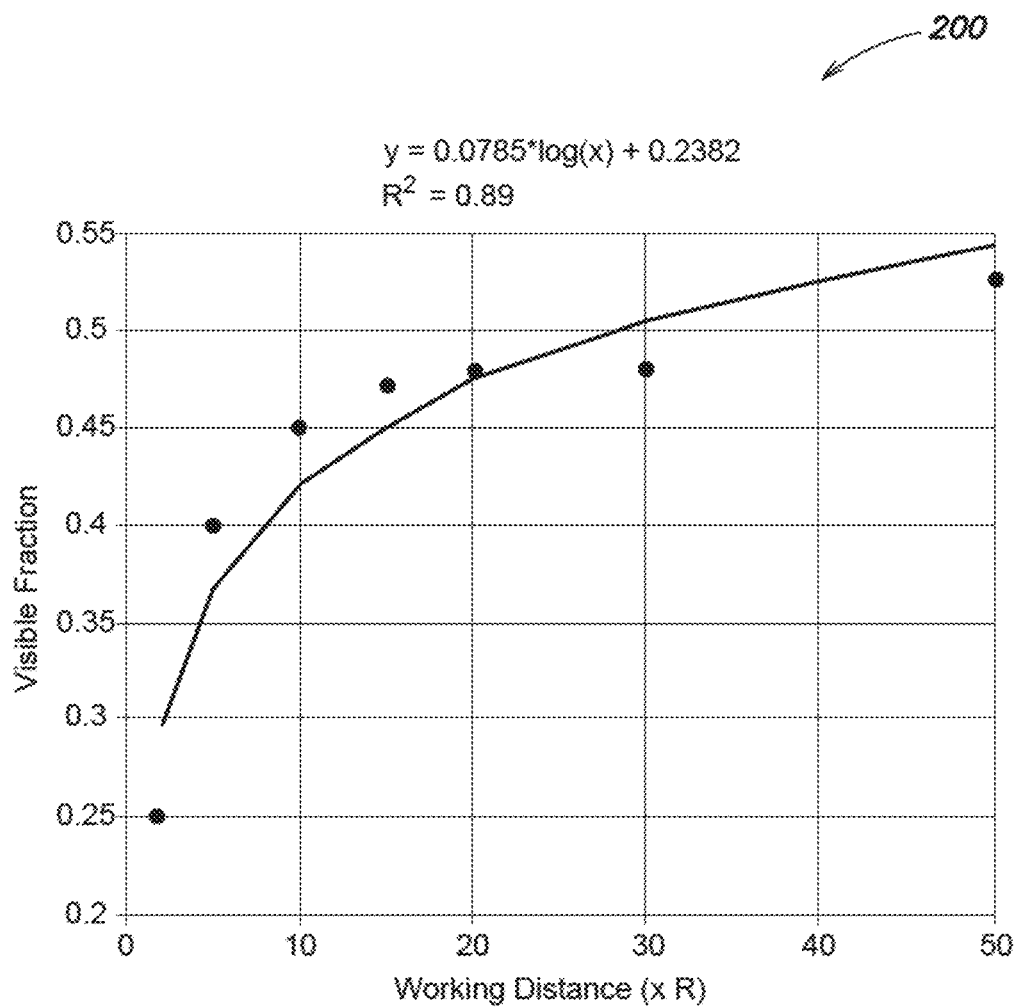
FIG. 2 shows an example graph representing the visible fraction of a sphere as a function of the working distance of a viewpoint of the sphere.

An estimate of the ratio of surface area of the visible portion 102 of the sphere 100 to its total surface area varies with working distance, such as shown in the example graph of FIG. 2. In FIG. 2, the fraction of visible to overall surface area is plotted against working distance of the viewpoint 104 for the unit sphere 100. Identical results were observed for a sphere with R=10. The fraction of the sphere 100 that is visible from the viewpoint 104 exceeds 0.5 due to the artifact of the analysis procedure that considers an entire triangle facet as visible even if only one vertex is visible. Overall, this analysis demonstrates the need to consider working distance and its relationship to object size as factors in dictating the fraction of object captured in its 3-D model.

A ray-tracing procedure is not necessarily a realistic representation of the actual working principles behind of SEM, where a thin cone of light illuminates a sample. Nevertheless, the response is similar or perhaps more complicated for shapes more complicated than a sphere. This could result in other factors becoming influential such as viewing angle and object size. This underscores the need to examine partial-view 3-D models of irregular shapes by accounting for the actual extent of the object captured.

Accounting for the characteristics of partial-view models may not be necessary when the object of interest is near-planar or where the focus of study is on a particular portion of its surface. But in studies shape and surface morphology together can provide insights into multiple processes. For example, highly irregular micro-scale particles of ash collected from explosive volcanic eruptions consist of complex surface morphological features such as vesicular imprints that can provide insights into magma dynamics and pre-eruptive conditions, capillary condensation induced aggregation, and enhanced sedimentation due to ice/hydrometeor nucleation. For these studies, partial-view DEMs are sufficient to obtain needed information. But if whole particle metrics like shape, surface area or volume can also be estimated the data can potentially provide insights into the atmospheric transport, aggregation, sedimentation and deposition of volcanic ash clouds and provide a better parameterization of ash in large scale volcanic ash transportation models and improve our ability to mitigate deadly volcanic ashfalls. Similar examples exist in other areas. The ability to simultaneously characterize shape and morphology of individual irregularly-shaped particles in particulate systems can lead to a better understanding of flow and transport problems, such as sediment transport in rivers and micromechanical behavior of granular media.

The surface area of regular-shaped, non-porous solids, also known as physical surface area (PSA), is well known (for example, surface area of a sphere of radius R: $A=4\pi r^2$). But naturally found materials (for example, soil particles) often contain internal and external pores structures, nano-scale roughness features and complex and often highly irregular geometry. For such complicated particles, shape is inherently related to the surface features and not necessarily internal structure. The commonly used metric of specific surface area (SSA) (PSA per unit mass) measured by the popular gas-absorption based BET method can include internal pore surfaces in its estimate as a result SSA can be orders of magnitude higher than surface area measured by other means. Thus, PSA is not a suitable proxy for the characterization of complex shapes. Surface area is defined based on a modified definition of geometric surface area (GSA). Typically, GSA is defined as the surface area of a 3-D shape estimated by assuming the particle to be of certain geometry. Usually a known geometry such as a sphere or ellipse is used to represent the object and the equivalent surface area is calculated. Modified GSA is the area represented by a closed, hollow, polyhedron constructed by a thin shell of scale-specific triangles. This polyhedron is a representation of the object's surface and it can be expected to capture the most prominent features of the object that makes up its shape. GSA is the areal sum of all outward facing triangular facets, and by extension the volume is the space enclosed by the polyhedral shape. This approach is extended to partial-view DEMs by defining GSA as the surface area of polyhedron that excludes from meshing the uncaptured surface. The volume of this "open surface" polyhedron is the sum of the volume of all tetrahedrons that are formed by the triangular faces with a point located in the interior of the particle. An approach that uses these principles and combines them with new formulations can be used to estimate the whole surface area and volume of an object from a partial-view DEM of the object.

Figure 3:
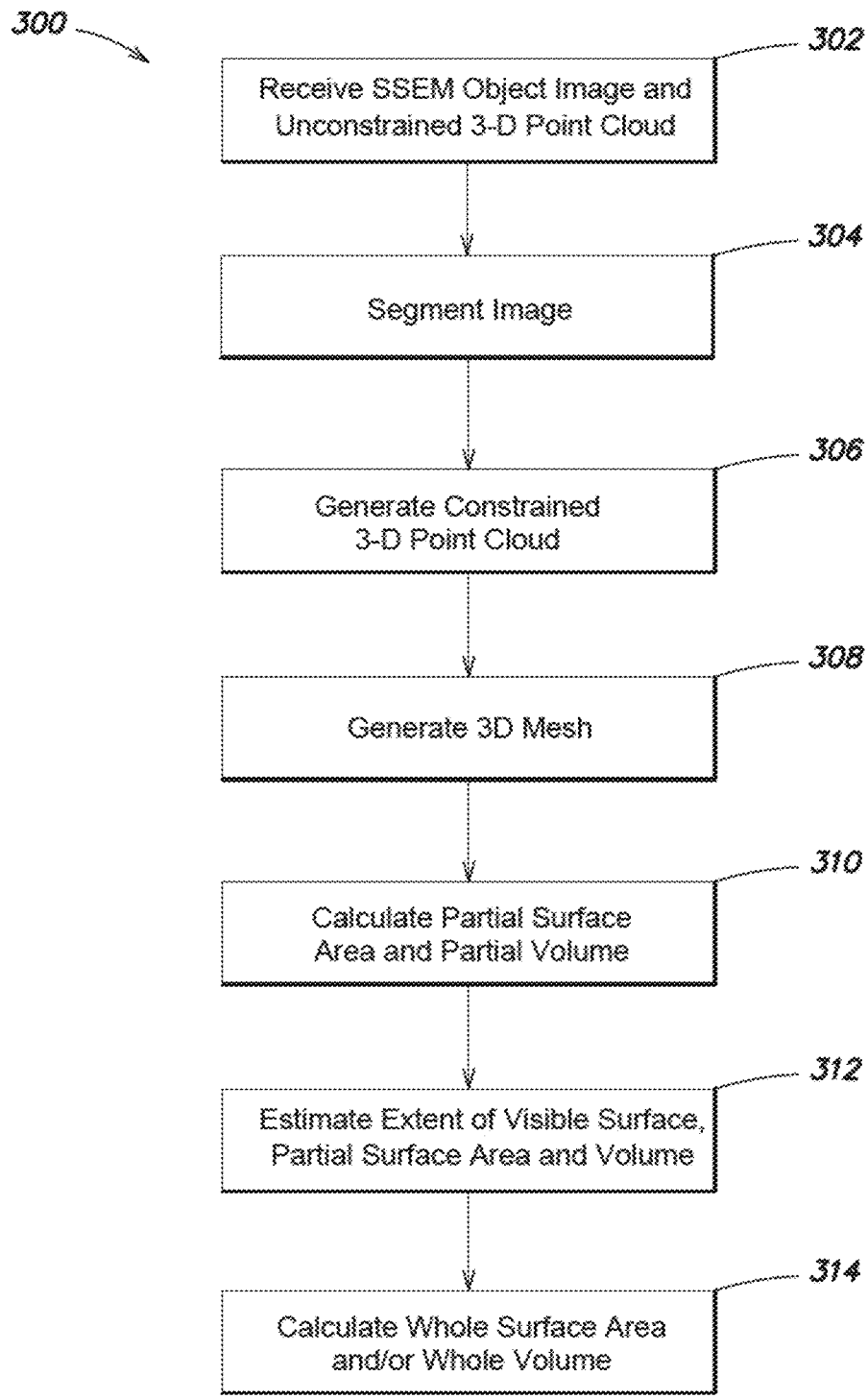
FIG. 3 is an example flow diagram for a method of estimating the whole surface area and volume of an object, in accordance with an embodiment of the present disclosure.

FIG. 3 is an example flow diagram 300 for a method of estimating the whole surface area and volume of an object, in accordance with an embodiment of the present disclosure.

The method 300 begins by receiving, at step 302, a single-view stereoscopic image of an object of interest and an unconstrained three-dimensional point cloud representation of the object of interest. The image can be generated by a stereoscopic scanning electron microscope, and can include a plurality of pixels representing the object of interest and possibly pixels representing other objects or features (i.e., the surroundings of the object of interest). The unconstrained three-dimensional point cloud can be generated using conventional techniques.

Object Segmentation and Physical Bounds

In the case where the image includes pixels representing objects or features other than the object of interest, the object of interest is isolated from other objects or features not relevant to the analysis by segmenting, at step 304, the image into a portion including the object of interest and a portion excluding the object of interest. For example, an image analysis technique commonly known as image thresholding is applied on one of the underlying stereoscopic images to isolate (or segment) the object of interest from other pixels in the image. In another example, a time-intensive segmentation can be performed by manually tracing a boundary around each object. In yet another example, automated image analysis approaches can be used if the boundary is complicated or if there is a large number of objects to segment. In some embodiments, thresholding algorithms are used to automatically identify pixels as being part of the object or background based on some mathematical criteria. Image analysis tools, in accordance with an embodiment, perform segmentation based on two different implementations of thresholding algorithms—entropy filter and Otsu filter. The entropy filter uses a statistical measure of randomness (entropy) to identify pixels based on the similarity of morphological textures within smaller regions of an image. The Otsu filter uses a bi-modal fit to the statistical distribution of pixel intensities to identify pixels as object or background.

Once the object is isolated within a closed polygon, the coordinates of the outermost pixels represent the object's boundary. This boundary is then used to extract a 2-D size parameter, data that is used later to estimate GSA and volume extracted for objects. The method of feret lengths, defined as the distance between parallel tangents on opposite sides of a 2-D boundary, is used as the 2-D size parameter. Mean feret diameter ($\overline{D_f}$) is the average of several feret lengths drawn at specific locations to reasonably approximate the boundary, a metric given by:

$$\overline{D_f} = \frac{1}{N}\sum_{n=1}^{360} F_n \quad (1)$$

Where, feret length ($F_n$) is calculated at each rotation. A total of 360 rotations, equivalent to 1 degree in rotation around a closed boundary, produces mean feret diameter.

Establishment of a Reference Origin and Coordinate System

The 3-D object can be formed by non-intersecting surfaces, that is, every triangular facet forming the surface is visible from a reference origin located in the interior of the object and is not obscured by another triangular facet. Objects that conform to this property have also been called "star-shaped," where there is at least one point in the interior of the object such that a line drawn between the point and any point on the surface lies entirely within the object. A wide variety of shapes conform to this property including all convex forms, and objects with minor concavities such as those derived from geological materials (for example, sand, rock, gravel, volcanic ash, powders).

Figure 4A:
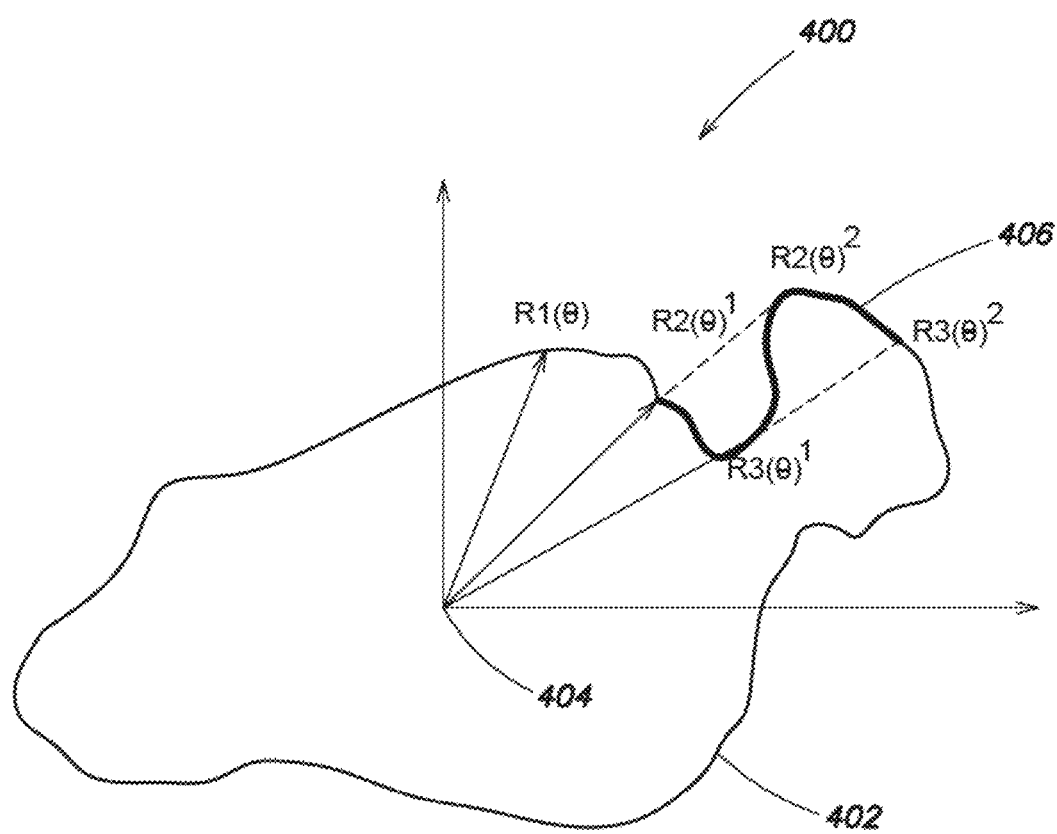
FIGS. 4A and 4B show examples of irregularly shaped three-dimensional (3-D) objects.
Figure 4B:
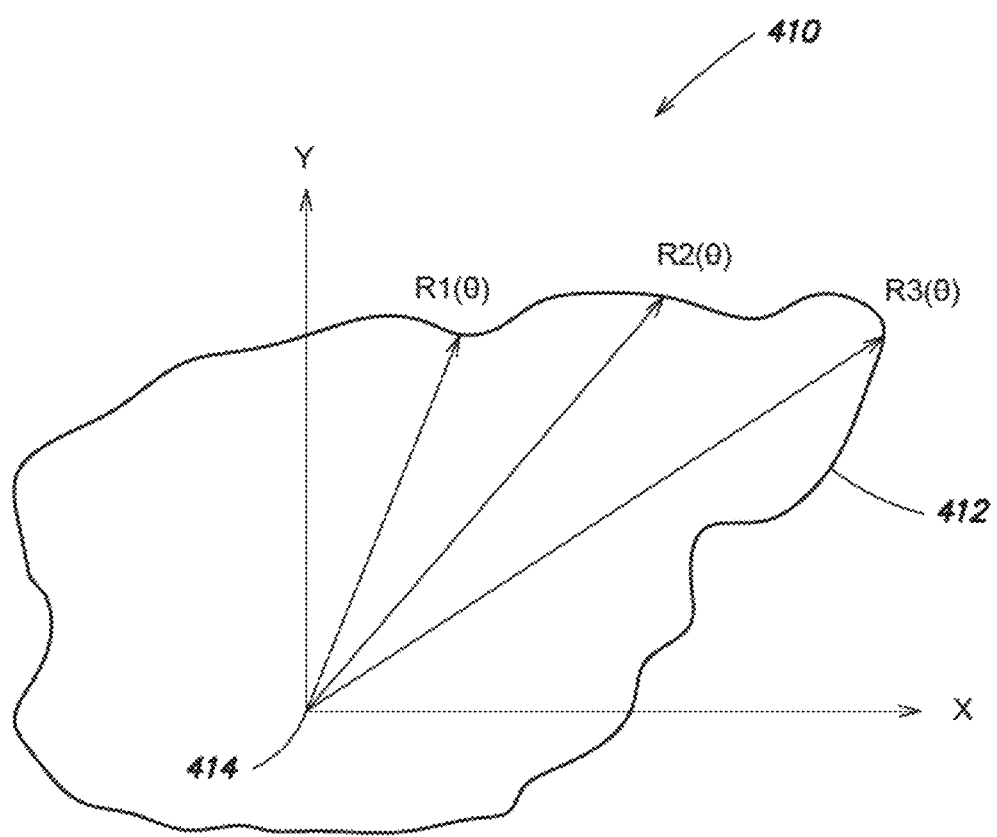

FIGS. 4A and 4B show examples of irregularly shaped three-dimensional (3-D) objects 400, 410. FIG. 4A shows a two-dimensional (2-D) boundary 402 of the non-star-shaped object 400 showing lines originating from its reference center 404 and meeting the boundary 402. A part of the boundary (dark line) 406 is not completely contained within the object, leading to a multi-valued function for R. This violates the rule of a star-shaped object. FIG. 4B shows a 2-D outline of the star-shaped object 410 showing all lines originating from its reference origin 414 are contained within the boundary 412 of the object 410.

Two factors can independently cause intersecting surfaces. (a) The selection of the reference origin. An origin that is too close to the surface may result in some triangle facets to obscure others. Considering an object with an open surface, an origin that is too far away could potentially be located exterior of the object and thus is not useful. (b) Sometimes intersecting surfaces are naturally part of the complex morphology. Other times errors resulting from DEM reconstruction cause concavities in the surface causing triangular facets close to the edges to form intersecting surfaces. This underscores the importance of locating the origin to minimize intersecting surfaces. Ideally, the centroid of the closed shape, defined as the geometric center of a thin-shelled 3-D shape with triangular facets of uniform mass determined by calculating the area-weighted average sum of all triangle centroids, would fit as the reference origin. But the presence of an open surface in the 3-D model makes its determination prone to errors.

Instead, an appropriate regular shape is fitted on the point cloud of the object, and the center of the shape is selected to act as centroid of the object. This approach has been tested on spheres, and ellipsoids of revolution (oblate and prolate spheroids) that best approximate the shape of geo-material like soil, rock and volcanic ash.

Referring again to FIG. 3, the method 300 further includes generating, at step 306, a constrained 3-D point cloud for fitting the regular shape from the unconstrained 3-D point cloud (possibly including the object of interest as well as its surroundings) and also from the original 2-D stereoscopic image of the object of interest. First, the physical bounds of the object in the third (z) dimension are identified from the information contained within the DEM. Each point on the surface of the segmented object designated in Cartesian coordinates is S(x, y, z), where x and y are derived from the pixel based planar coordinates captured on a stereoscopic image, and z is derived from the DEM construction. The approach of object segmentation and mean feret length estimation, described earlier, provided the physical bounds of the object in two dimensions (x and y), the presence of the features outside of the isolated particle are used to establish its physical bound in the depth (z) direction. The object of interest rests on an examination stub, a planar metal surface on which a sample is deposited for SSEM analysis. By approximating this as a plane, its equation in 3-D space can be written as:

$$B_1 x + B_2 y + B_3 z + B_4 = 0 \quad (2)$$

The quality of the plane captured in SSEM-based 3-D models can vary among individual models. Large errors in elevation can be recorded when the examination stub lacks texture or there are no neighboring objects to provide a reference for 3-D reconstruction. Four points that are visible and part of the planar stub object are selected as its best representation. Solving Eq. (2) produces the coefficients $B_1$ to $B_4$ and thus the equation of the plane. The projection or "footprint" of 2-D coordinates of point cloud S(x,y) on sample plane is produced by solving Eq. (2). The projection or "footprint" of the 2-D coordinates of point cloud S(x, y) on the sample plane can be determined as follows:

$$z_p = \frac{-(B_1 x + B_2 y + B_4)}{B_3} \quad (3)$$

This produces a set of points P(x, y, $z_p$) that are most likely to contain the physical bound of the object, i.e., those parts of the object that rest on the sample stub. This is used to expand the point cloud:

$$S'(x,y,z)=[S(x,y,z)P(x,y,z_p)] \quad (4)$$

A closely conforming regular shape is then fitted using a least-squares approach.

Capabilities to fit spheres, spheroids (oblate or prolate) and ellipsoids on a 3-D point cloud can be used, allowing the selection of the shape that best approximates the outline of the object. The centroid of this regular shape O($x_c$, $y_c$, $z_c$) is selected as the reference origin and the point cloud of the object S(x, y, z) is transformed so that O($x_c$=0, $y_c$=0, $z_c$=0) to give:

$$S(x',y',z') \rightarrow S(x-x_c, y-y_c, z-z_c) \quad (5)$$

Surface Construction

Referring again to FIG. 3, the method 300 further includes generating, at step 308, a 3-D mesh. The points cloud S(x', y', z') representing the object is meshed using an approach called Delaunay triangulation, allowing its reconstruction as an open shell formed by a thin sheet and discretized by a collection of triangular faces. A custom, computationally efficient, constrained Delaunay triangulation method can be used so that procedure produces a structured mesh that is within the bounds of the object.

Figure 5A:
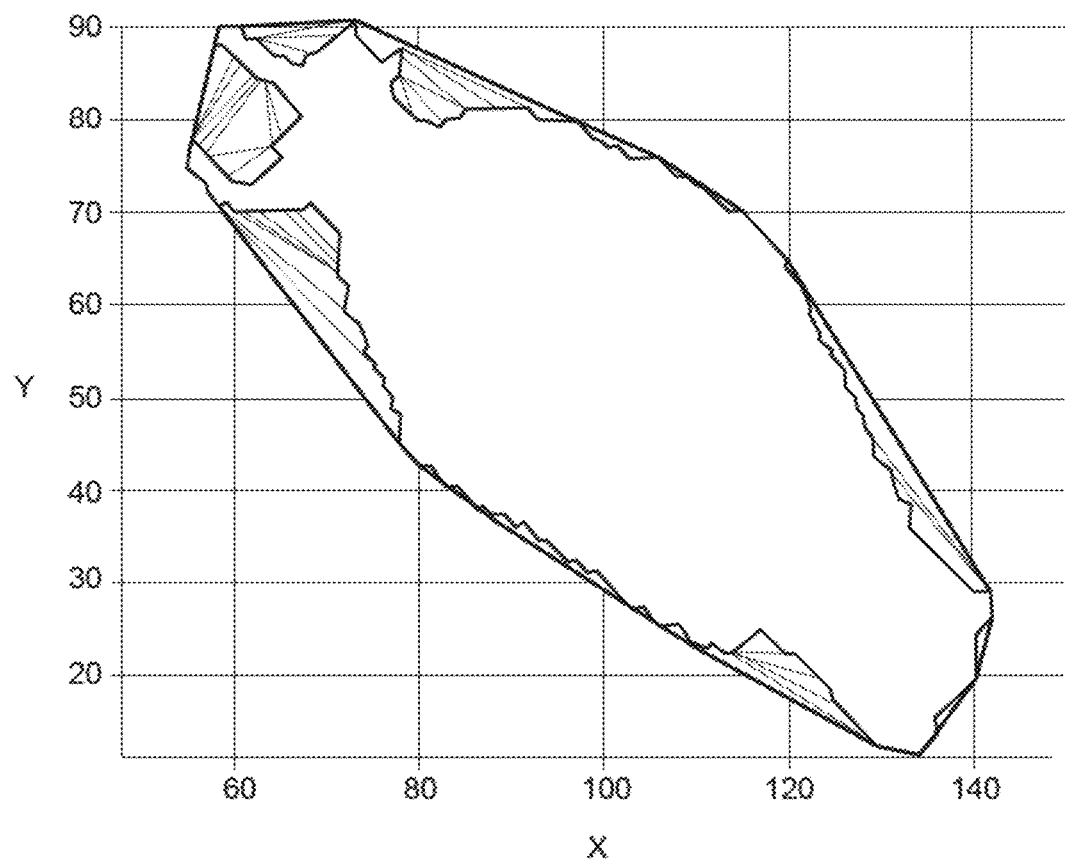
FIGS. 5A-C show an unstructured Delaunay triangulation on an arbitrary two-dimensional (2-D) object's point cloud.

The development of a structured mesh of a DEM point cloud so that the resulting polyhedron is within the physical bounds of the object is an important and challenging task. 3-D models built from 2-D stereoscopic images were used to make the data is amenable to perform 2-D meshing first and extended to the 3-D domain. This helps with computational efficiency and also provides a relatively simple approach to what is a complex exercise. A step-by-step description, in accordance with an embodiment, is provided below using an arbitrarily created complex 2-D boundary (see, for example, FIG. 5A). The boundary contains convex and concave features similar to boundaries of complex shapes like geo-materials (for example, pebbles, sand grains, volcanic ash, etc.). FIG. 5A shows an unstructured Delaunay triangulation on an arbitrary 2-D object's point cloud. The meshing procedure is designed to identify the object convex hull, and connect every vertex with one or more triangles. As a result, the boundary of the object is not respected by the representation.

Development of an Unstructured Mesh

As a first step, an unstructured mesh using a Delaunay triangulation approach is implemented on a (2-D) image of the object, such as shown in FIG. 5A. Each node or vertex within and on the object's boundary is connected to form a triangle. Every node is connected to one or more triangles. Any commonly used Delaunay triangulation algorithm will first determine the convex hull and connect each node to a triangle. Thus, any concave features present within the object are not represented in the mesh.

Identification of Nodes within and on the Polygonal Boundary

Figure 5B:
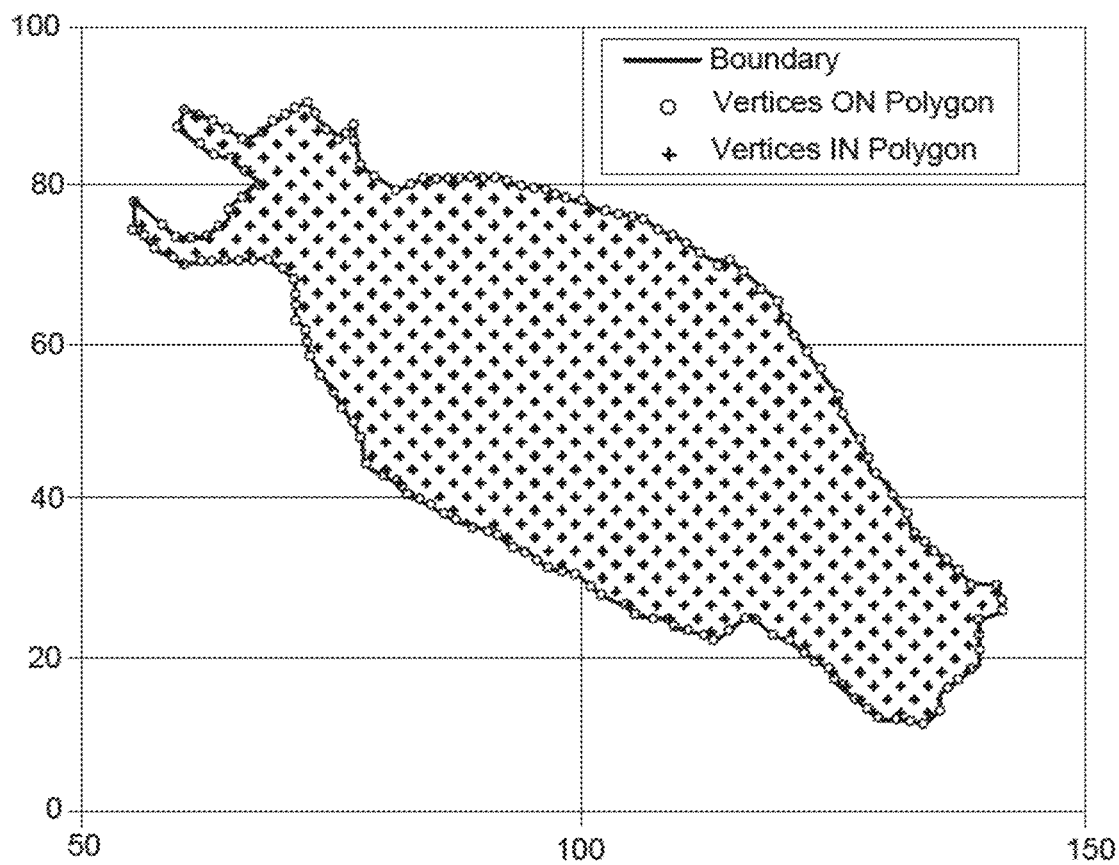

A custom approach to numerically identify parts of the unstructured mesh for removal is used so that the triangulation is constrained within the boundary of the object. The following three steps describe this procedure:

(1) Identify triangles where each vertex is one of the interior nodes (D1) (see, for example, FIG. 5B, where nodes on the boundary are differentiated from nodes within the polygon).

(2) Identify triangles formed by two interior nodes and one boundary node (D2) (see, for example, FIG. 5B).

(3) Develop a new mesh with triangles within D1 and D2 forming the object.

Figure 5C:
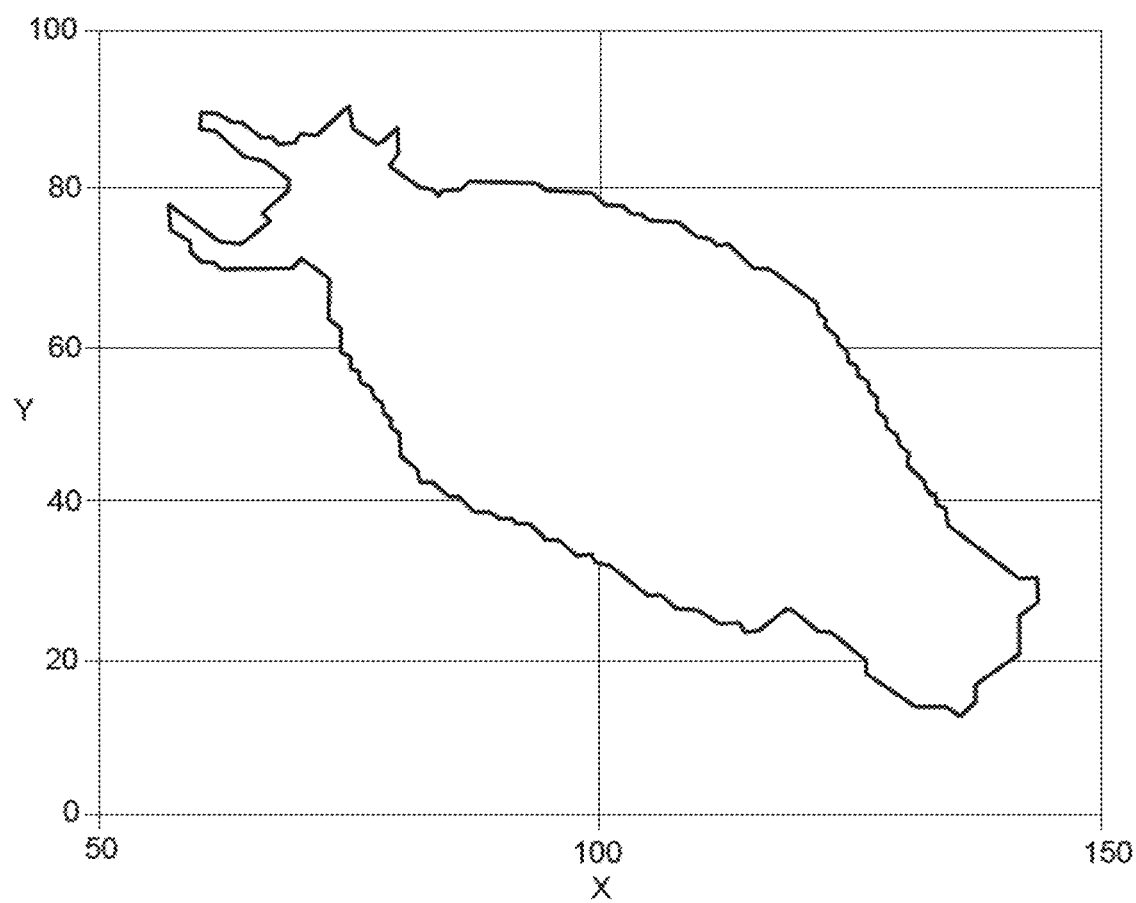

The mesh formed by D1, and D2 is constrained for the physical boundaries of the object (see, for example, FIG. 5C, where triangles formed only by the nodes within the boundary with the nodes on the boundary are retained). This creates a constrained triangulation that represents the boundary of the object. With connectivity created by this 2-D mesh it can be extended to the 3-D domain simply by using the coordinates of the third dimension in developing the 3-D mesh.

Surface Area, Volume

Figure 6:
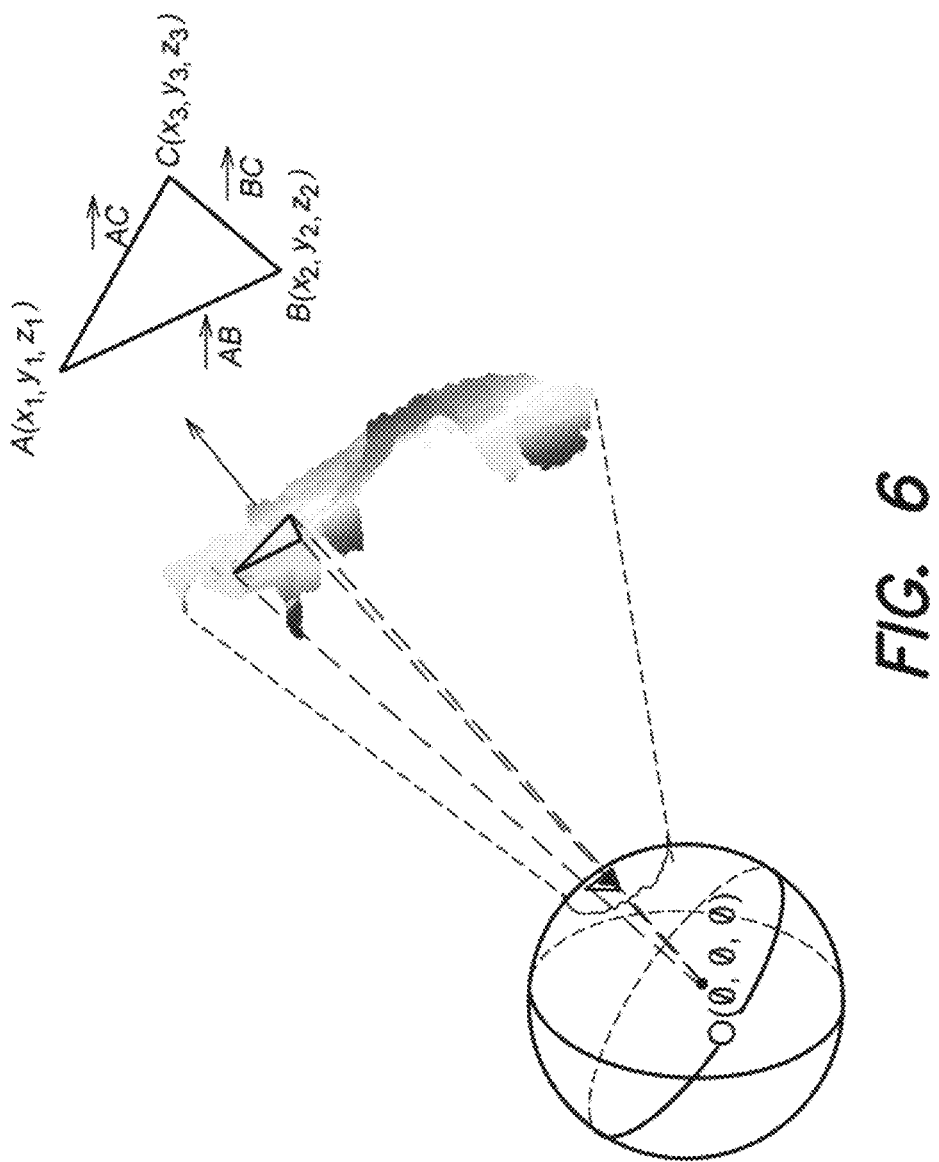
FIG. 6 shows a solid angle of a plane triangle subtended at an arbitrary point O (0, 0, 0) in space.

Referring again to FIG. 3, the method 300 further includes calculating, at step 310, a partial surface area and partial volume of the 3-D mesh. The meshed surface formed by triangles allows the estimation of geometrical properties. The area of a triangle in space, represented in Cartesian vertices A($x_1$, $y_1$, $z_1$), B($x_2$, $y_2$, $z_2$), and C($x_3$, $y_3$, $z_3$) is given in vector form as (see, for example, FIG. 6):

$$A_t = \frac{1}{2} |\vec{AB} \times \vec{AC}| \quad (6)$$

where, vectors $\vec{A}$, $\vec{B}$ and $\vec{C}$ are vectors formed by each side of the triangle in space and are given as:

$$\vec{AB} = (x_2 - x_1)\hat{i} + (y_2 - y_1)\hat{j} + (z_2 - z_1)\hat{k} \quad (7a)$$

$$\vec{AC} = (x_1 - x_3)\hat{i} + (y_1 - y_3)\hat{j} + (z_1 - z_3)\hat{k} \quad (7b)$$

where $\hat{i}$, $\hat{j}$, and $\hat{k}$ are unit vectors along the x, y and z axes respectively. Each triangle in the mesh also forms a tetrahedron with the reference origin acting as the fourth vertex (see, for example, FIG. 6). FIG. 6 shows a solid angle of a plane triangle subtended at an arbitrary point O (0, 0, 0) in space. The triangle is part of an arbitrarily shaped meshed surface. Point O is represented as an exaggerated unit sphere. The surface shades part of the unit sphere, as does the triangle. The solid angle of the planar triangle is the area of the spherical triangle projected onto the unit sphere. The planar triangle forms a tetrahedron with O as the fourth vertex. The volume of the open surface is represented by the volume of all tetrahedrons formed by the meshed surface. The volume occupied by a tetrahedron is given as:

$$V_t = \frac{|\vec{a} \cdot (\vec{b} \times \vec{c})|}{6} \quad (8)$$

where, $\vec{a}$, $\vec{b}$ and $\vec{c}$ are vectors formed by each vertex of the triangle with origin O(0,0,0):

$$\vec{a} = x_1 \hat{i} + y_1 \hat{j} + z_1 \hat{k} \quad (9a)$$

$$\vec{b} = x_2 \hat{i} + y_2 \hat{j} + z_2 \hat{k} \quad (9b)$$

$$\vec{c} = x_3 \hat{i} + y_3 \hat{j} + z_3 \hat{k} \quad (9c)$$

The surface area and volume is determined by summing up over the surface.

$$S_s = \sum_{i=1}^{n} A_t^i \quad (10)$$

$$V_s = \sum_{i=1}^{n} V_t^i \quad (11)$$

where $S_s$ is the surface area of the object, $V_s$ the closed volume of object, and n is the number of triangles that form the surface.

Visible Fraction of Object

To estimate the whole object metrics (surface area and volume), the extent of the visible portion of the object's surface is quantified by estimating the physical fraction of the whole object captured in the single-view image. Then, the surface area of the part object and a particular form of its enclosed volume is estimated. Referring again to FIG. 3, the method 300 further includes estimating, at step 312, an extent of the visible surface, partial surface area and volume by calculating a physical fraction of the object of interest captured by the DEM. Subsequently, the estimate of the physical fraction is used to calculate, at step 314, a whole surface area of the object of interest based on the partial surface area of the object of interest and the estimated extent of the visible surface of the object of interest, and a whole volume of the object of interest based on the partial volume of the object of interest and the estimated extent of the visible surface of the object of interest.

The solid angle ($\Omega_s$) of shape A located orthogonally at a distance r is defined as the area projected by A onto a unit sphere (see, for example, FIG. 6). By definition $$\Omega s = \frac{A}{r^2},$$

where $\Omega$s is given in units of steradians. Thus, the solid angle of a thin shelled sphere of radius r subtended at its centroid is given by $$\Omega s = \frac{4\pi r^2}{r^2} = 4\pi.$$

By extension the maximum solid angle subtended at a point is $4\pi$. Using a set of example shapes, the total solid angle of any closed thin shelled object (regardless of shape) subtended at a point in its interior is also given by $\Omega s = 4\pi$, provided it is made of non-intersecting surfaces.

Using this result, the solid angle of a randomly oriented constituent triangle subtended at the origin O is determined using a numerically optimized formulation:

$$\tan\left(\frac{1}{2}\Omega^i\right) = \frac{|\vec{a_1}\ \vec{a_2}\ \vec{a_3}|}{a_1 a_2 a_3 + (\vec{a_1} \cdot \vec{a_2})a_3 + (\vec{a_1} \cdot \vec{a_3})a_2 + (\vec{a_2} \cdot \vec{a_3})a_1} \quad (12)$$

where, $\Omega^i$, is the solid angle contributed by one constituent triangle of the mesh. Vectors $\vec{a_1}$, $\vec{a_2}$ and $\vec{a_3}$ are defined by Eqs. 9a-c. The numerator $|\vec{a_1}\ \vec{a_2}\ \vec{a_3}|$ represents the determinant of the three vectors, calculated by their scalar triple product. The total solid angle of 3-D object (with the open surface) is then the sum of the solid angles of all constituent triangles subtended at the origin O.

$$\Omega_s = \sum_{i=1}^{n} \Omega^i \quad (13)$$

Since the expected total solid angle of a whole 3-D object with no intersecting surfaces subtended at a point in the interior of the object is $4\pi$, the total (visible) physical fraction of the DEM captured is defined as:

$$\Delta_{object} = \frac{\Omega_s}{4\pi} \quad (14)$$

Inherent in this equation is the assumption that the surface that was not captured has similar morphological characteristics, composition and density as the rest of the object and is devoid of intersecting surfaces (star-shaped object). As a next step, the relationship between the cumulative physical fraction of the object ($\Delta_{object}$), and its surface area and volume is established. This relationship is solely determined by the shape of the object. The following shapes were examined for this relationship:

a) Spherical cone: A spherical cone representing a surface of revolution obtained from a sphere. Physically, a spherical cone consists of a cone and a spherical cap, a region of the sphere that lies above any given plane. The surface area of the spherical cap is only considered here (that excludes surface area of the spherical cone), which is given as, $A = 2\pi Rh$, where R is the radius of sphere of which the spherical cap is a region, and h is the height of the spherical cap. The volume of the spherical cone is given by, $V = \frac{2}{3}\pi R^2 h$. A different spherical cone can be defined within a hemisphere by varying the angle $\theta (0 < \theta < \pi/2)$. Increments of 1 degree in $\theta$ were used to generate a spherical cone to determine the solid angle subtended at the center (O) of the sphere. Spherical cone serves as a representation of a partial view model, and "enclosing" its surface using a reference origin.

a) Ellipsoid: An ellipsoid given by the equation $$\frac{x^2}{a^2} + \frac{y^2}{b^2} + \frac{z^2}{c^2} = 1,$$

where, a, b, and c are semi-axes lengths was generated numerically with approximately 9900 points (a=5, b=3 and c=3) and surface meshed by a Delaunay triangulation procedure.

b) Sand grains: 10 DEMs of computer-generated sand grains of arbitrary shapes were used.

For a sphere, surface area and volume were found to vary linearly with cumulative physical fraction ($\Delta_{object}$ varying from 0 to 1). Whereas, for an ellipse and each sand grain, surface area and volume were weakly nonlinear. The degree of non-linearity is observed to be related to the shape of the object. As a general formulation, in this disclosure, without the loss of accuracy an assumption it can reasonably be assumed that for a given shape the whole object surface area ($S_{whole}$) and volume ($V_{whole}$) scales linearly with $\Delta_{object}$, giving:

$$S_{whole} = \frac{S_s}{\Delta_{object}} \quad (15)$$

$$V_{whole} = \frac{V_s}{\Delta_{object}} \quad (16)$$

Computing Device

Figure 7:
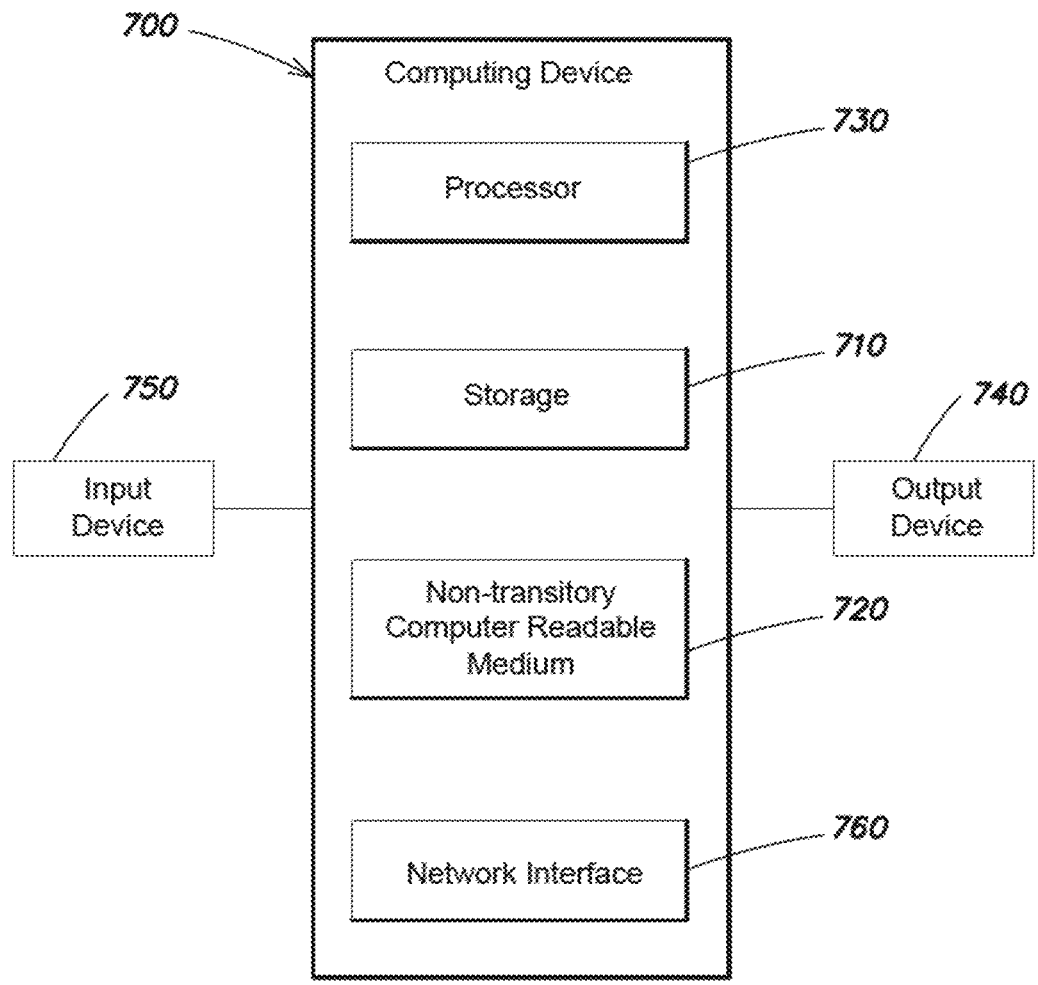
FIG. 7 is a block diagram representing an example computing device that may be used to perform any of the techniques as variously described in this disclosure.

FIG. 7 is a block diagram representing an example computing device 700 that may be used to perform any of the techniques as variously described in this disclosure. For example, the method of FIG. 3, or any portion thereof, may be implemented in the computing device 700. The computing device 700 may be any computer system, such as a workstation, desktop computer, server, laptop, handheld computer, tablet computer (e.g., the iPad® tablet computer), mobile computing or communication device (e.g., the iPhone® mobile communication device, the Android™ mobile communication device, and the like), VR device or VR component (e.g., headset, hand glove, camera, treadmill, etc.) or other form of computing or telecommunications device that is capable of communication and that has sufficient processor power and memory capacity to perform the operations described in this disclosure. A distributed computational system may be provided including a plurality of such computing devices.

The computing device 700 includes one or more storage devices 710 or non-transitory computer-readable media 720 having encoded thereon one or more computer-executable instructions or software for implementing techniques as variously described in this disclosure. The storage devices 710 may include a computer system memory or random access memory, such as a durable disk storage (which may include any suitable optical or magnetic durable storage device, e.g., RAM, ROM, Flash, USB drive, or other semiconductor-based storage medium), a hard-drive, CD-ROM, or other computer readable media, for storing data and computer-readable instructions or software that implement various embodiments as taught in this disclosure. The storage device 710 may include other types of memory as well, or combinations thereof. The storage device 710 may be provided on the computing device 700 or provided separately or remotely from the computing device 700. The non-transitory computer-readable media 720 may include, but are not limited to, one or more types of hardware memory, non-transitory tangible media (for example, one or more magnetic storage disks, one or more optical disks, one or more USB flash drives), and the like. The non-transitory computer-readable media 720 included in the computing device 700 may store computer-readable and computer-executable instructions or software for implementing various embodiments. The computer-readable media 720 may be provided on the computing device 700 or provided separately or remotely from the computing device 700.

The computing device 700 also includes at least one processor 730 for executing computer-readable and computer-executable instructions or software stored in the storage device 710 or non-transitory computer-readable media 720 and other programs for controlling system hardware. Virtualization may be employed in the computing device 700 so that infrastructure and resources in the computing device 700 may be shared dynamically. For example, a virtual machine may be provided to handle a process running on multiple processors so that the process appears to be using only one computing resource rather than multiple computing resources. Multiple virtual machines may also be used with one processor.

A user may interact with the computing device 700 through an output device 740, such as a screen or monitor, which may display one or more user interfaces provided in accordance with some embodiments. The output device 740 may also display other aspects, elements or information or data associated with some embodiments. The computing device 700 may include other input devices 750 for receiving input from a user, for example, a keyboard, a joystick, a game controller, a pointing device (e.g., a mouse, a user's finger interfacing directly with a touch-sensitive display device, etc.), or any suitable user interface, including a VR headset. The computing device 700 may include other suitable conventional I/O peripherals. The computing device 700 includes or is operatively coupled to various suitable devices for performing one or more of the aspects as variously described in this disclosure, including but not limited to a stereoscopic scanning electron microscope or other device configured to process images obtained from such a microscope (for example, a device configured to generate an unconstrained 3-D model or point cloud from the image(s)).

The computing device 700 may run any operating system, such as any of the versions of Microsoft® Windows® operating systems, the different releases of the UNIX® and Linux® operating systems, any version of the MacOS® for Macintosh computers, any embedded operating system, any real-time operating system, any open source operating system, any proprietary operating system, any operating systems for mobile computing devices, or any other operating system capable of running on the computing device 700 and performing the operations described in this disclosure. In an embodiment, the operating system may be run on one or more cloud machine instances.

In other embodiments, the functional components/modules may be implemented with hardware, such as gate level logic (e.g., field-programmable gate array or FPGA) or a purpose-built semiconductor (e.g., application-specific integrated circuit or ASIC). Still other embodiments may be implemented with a microcontroller having a number of input/output ports for receiving and outputting data, and a number of embedded routines for carrying out the functionality described in this disclosure. In a more general sense, any suitable combination of hardware, software, and firmware can be used, as will be apparent.

As will be appreciated in light of this disclosure, the various modules and components of the system is implemented in software, such as a set of instructions (e.g., HTML, XML, C, C++, object-oriented C, JavaScript®, Java®, BASIC, MATLAB®, etc.) encoded on any computer readable medium or computer program product (e.g., hard drive, server, disc, or other suitable non-transitory memory or set of memories), that when executed by one or more processors, cause the various methodologies provided in this disclosure to be carried out. It will be appreciated that, in some embodiments, various functions and data transformations performed by the user computing system, as described in this disclosure, can be performed by similar processors or databases in different configurations and arrangements, and that the depicted embodiments are not intended to be limiting. Various components of this example embodiment, including the computing device 800, may be integrated into, for example, one or more desktop or laptop computers, workstations, tablets, smart phones, game consoles, set-top boxes, or other such computing devices. Other componentry and modules typical of a computing system, such as processors (e.g., central processing unit and co-processor, graphics processor, etc.), input devices (e.g., keyboard, mouse, touch pad, touch screen, etc.), and operating system, are not shown but will be readily apparent.

Numerous embodiments will be apparent in light of the present disclosure, and features described herein can be combined in any number of configurations. One example embodiment includes a computer-implemented method of estimating a whole object surface area and volume of a micro-scale three-dimensional model with a partially visible surface. The method includes receiving, by a processor-based system, a single-view stereoscopic image of an object of interest and an unconstrained three-dimensional point cloud representation of the object of interest, the image generated by a stereoscopic scanning electron microscope and having a plurality of pixels representing the object of interest; generating, by the processor-based system, a constrained three-dimensional point cloud using the image, the unconstrained three-dimensional point cloud representation of the object of interest, and a digital elevation model (DEM) of the object generated from the image, the constrained three-dimensional point cloud including a plurality of points representing a surface of the object of interest within a reference coordinate system; generating, by the processor-based system and using the constrained three-dimensional point cloud, a three-dimensional mesh representing an estimate of the surface of the object of interest; calculating, by the processor-based system, at least one of: a partial surface area of the object of interest using the three-dimensional mesh; and a partial volume of the object of interest using the three-dimensional mesh; estimating, by the processor-based system, an extent of a visible surface of the object of interest by calculating a physical fraction of the object of interest captured by the DEM; and calculating, by the processor-based system, at least one of: a whole surface area of the object of interest based on the partial surface area of the object of interest and the estimated extent of the visible surface of the object of interest; and a whole volume of the object of interest based on the partial volume of the object of interest and the estimated extent of the visible surface of the object of interest. In some cases, generating the constrained three-dimensional point cloud includes identifying physical bounds of the object of interest in one dimension using the DEM, and in two other dimensions using pixel-based planar coordinates of the object of interest in the image; calculating a set of points containing the physical bounds of the object of interest; determining the connectivity of points to form a three-dimensional mesh so as to not violate the physical bounds of the object; and adding the set of points containing the physical bounds of the object of interest to the constrained three-dimensional point cloud, wherein an origin of the reference coordinate system is a centroid of a regular shape approximating the physical bounds of the object of interest. In some cases, the method includes segmenting, by the processor-based system, the image into a portion including the object of interest and a portion excluding the object of interest, wherein the constrained three-dimensional point cloud is further generated using the segmented portion of the image including the object of interest. In some such cases, the segmenting includes applying a thresholding algorithm to the image to obtain a two-dimensional boundary of the object of interest, the thresholding algorithm including one of an entropy filter and an Otsu filter, and wherein the constrained three-dimensional point cloud is further generated based at least in part on the two-dimensional boundary of the object of interest. In some further such cases, the method includes identifying, by the processor-based system, a three-dimensional boundary of the object of interest by projecting a plane of the two-dimensional boundary of the object of interest onto a sample plane, wherein the constrained three-dimensional point cloud is further generated based on the three-dimensional boundary of the object of interest. In yet some further cases, the constrained three-dimensional point cloud is further generated by fitting the three-dimensional boundary of the object of interest to a regular shape. In some cases, generating the three-dimensional mesh includes applying a Delaunay triangulation to the constrained three-dimensional point cloud, and wherein the three-dimensional mesh comprises a plurality of triangles. In some such cases, the partial surface area of the object of interest is a function of an area of each triangle in the three-dimensional mesh, and wherein the partial volume of the object of interest is a function of a volume of each triangle in the three-dimensional mesh with respect to a common reference origin of the three-dimensional mesh. In some cases, the physical fraction of the object of interest captured by the DEM is a function of a sum of solid angles of all triangles in the three-dimensional mesh subtended at a reference origin of the three-dimensional mesh.

The foregoing description and drawings of various embodiments are presented by way of example only. These examples are not intended to be exhaustive or to limit the invention to the precise forms disclosed. Alterations, modifications, and variations will be apparent in light of this disclosure and are intended to be within the scope of the invention as set forth in the claims.

What is claimed is:

1. A computer-implemented method of estimating a whole object surface area and volume of a micro-scale three-dimensional model with a partially visible surface, the method comprising:
   receiving, by a processor-based system, a single-view stereoscopic image of an object of interest and an unconstrained three-dimensional point cloud representation of the object of interest, the image generated by a stereoscopic scanning electron microscope and having a plurality of pixels representing the object of interest;
   generating, by the processor-based system, a constrained three-dimensional point cloud using the image, the unconstrained three-dimensional point cloud representation of the object of interest, and a digital elevation model (DEM) of the object generated from the image, the constrained three-dimensional point cloud including a plurality of points representing a surface of the object of interest within a reference coordinate system;
   generating, by the processor-based system and using the constrained three-dimensional point cloud, a three-dimensional mesh representing an estimate of the surface of the object of interest;
   calculating, by the processor-based system, at least one of:
      a partial surface area of the object of interest using the three-dimensional mesh; and
      a partial volume of the object of interest using the three-dimensional mesh;

estimating, by the processor-based system, an extent of a visible surface of the object of interest by calculating a physical fraction of the object of interest captured by the DEM; and calculating, by the processor-based system, at least one of:

a whole surface area of the object of interest based on the partial surface area of the object of interest and the estimated extent of the visible surface of the object of interest; and a whole volume of the object of interest based on the partial volume of the object of interest and the estimated extent of the visible surface of the object of interest.

2. The method of claim 1, wherein generating the constrained three-dimensional point cloud comprises:

identifying physical bounds of the object of interest in one dimension using the DEM, and in two other dimensions using pixel-based planar coordinates of the object of interest in the image;

calculating a set of points containing the physical bounds of the object of interest;

determining a connectivity of points to form a three-dimensional mesh so as to not violate the physical bounds of the object; and adding the set of points containing the physical bounds of the object of interest to the constrained three-dimensional point cloud, wherein an origin of the reference coordinate system is a centroid of a regular shape approximating the physical bounds of the object of interest.

3. The method of claim 1, further comprising segmenting, by the processor-based system, the image into a portion including the object of interest and a portion excluding the object of interest, wherein the constrained three-dimensional point cloud is further generated using the segmented portion of the image including the object of interest.

4. The method of claim 3, wherein segmenting includes applying a thresholding algorithm to the image to obtain a two-dimensional boundary of the object of interest, the thresholding algorithm including one of an entropy filter and an Otsu filter, and wherein the constrained three-dimensional point cloud is further generated based at least in part on the two-dimensional boundary of the object of interest.

5. The method of claim 4, further comprising identifying, by the processor-based system, a three-dimensional boundary of the object of interest by projecting a plane of the two-dimensional boundary of the object of interest onto a sample plane, wherein the constrained three-dimensional point cloud is further generated based on the three-dimensional boundary of the object of interest.

6. The method of claim 5, wherein the constrained three-dimensional point cloud is further generated by fitting the three-dimensional boundary of the object of interest to a regular shape.

7. The method of claim 1, wherein generating the three-dimensional mesh includes applying a Delaunay triangulation to the constrained three-dimensional point cloud, and wherein the three-dimensional mesh comprises a plurality of triangles.

8. The method of claim 7, wherein the partial surface area of the object of interest is a function of an area of each triangle in the three-dimensional mesh, and wherein the partial volume of the object of interest is a function of a volume of each triangle in the three-dimensional mesh with respect to a common reference origin of the three-dimensional mesh.

9. The method of claim 1, wherein the physical fraction of the object of interest captured by the DEM is a function of a sum of solid angles of all triangles in the three-dimensional mesh subtended at a reference origin of the three-dimensional mesh.

* * * * *